United States Patent
Kim et al.

(10) Patent No.: US 6,746,972 B1
(45) Date of Patent: Jun. 8, 2004

(54) APPARATUS FOR AND METHOD OF HEAT-TREATING A WAFER

(75) Inventors: Choung Hyep Kim, Suwon (KR); Sung Il Jang, Kwacheon (KR); Kyung Seo Park, Yongin (KR); Ki Hyon Chyun, Suwon (KR); Hee Sun Chab, Suwon (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 721 days.

(21) Appl. No.: 09/605,660

(22) Filed: Jun. 28, 2000

(30) Foreign Application Priority Data

Jun. 29, 1999 (KR) .......................... 1999-25341

(51) Int. Cl.[7] ............................................. H01L 21/26
(52) U.S. Cl. ...................... 438/795; 438/799; 414/935
(58) Field of Search ................. 438/795, 799, 438/477; 414/935; 219/444.1, 543, 502, 448.1, 490; 118/725, 728; 165/80.1

(56) References Cited

U.S. PATENT DOCUMENTS

| | | | | |
|---|---|---|---|---|
| 5,778,969 A | * | 7/1998 | Kyung et al. .............. 165/80.1 |
| 5,981,913 A | * | 11/1999 | Kadomura et al. ........ 219/444.1 |
| 6,185,839 B1 | * | 2/2001 | Kholodenko et al. ......... 34/255 |
| 6,403,933 B1 | * | 6/2002 | Strodtbeck et al. ......... 219/502 |
| 6,449,871 B1 | * | 9/2002 | Kholodenko et al. ......... 34/255 |
| 6,508,885 B1 | * | 1/2003 | Moslehi et al. ............. 118/728 |
| 2002/0096117 A1 | * | 7/2002 | Futamura et al. .......... 118/729 |

FOREIGN PATENT DOCUMENTS

JP 6-177141 6/1994
JP 6-181173 6/1994

* cited by examiner

*Primary Examiner*—Matthew Smith
*Assistant Examiner*—V. Yevsikov
(74) *Attorney, Agent, or Firm*—Volentine Francos, PLLC

(57) ABSTRACT

An apparatus for and a method of heat-treating a wafer for use in producing a semiconductor device ensures a desired distribution of surface temperatures across the wafer. Spacers are used to space the wafer above a heat transfer plate. The spacers can be used to adjust the spacing and inclination of the wafer relative to the heat transfer plate by predetermined amounts determined in advance to produce the desired distribution of surface temperatures across the wafer during heat-treatment. With the present invention, wafers can be heat-treated during production using a plurality of bake units disposed in parallel because each of the bake units can be precisely adjusted using the spacers to produce surface temperature distributions similar to a standard surface temperature distribution. Accordingly, the productivity of the semiconductor manufacturing process can be markedly enhanced.

5 Claims, 7 Drawing Sheets

APPARATUS FOR AND METHOD OF HEAT-TREATING A WAFER

BACKGROUND OF THE INVENTION

1. Field of the Invention

The present invention relates to an apparatus for and to a method of temperature-conditioning a wafer in the process of manufacturing a semiconductor device. More particularly, the present invention relates to an apparatus for and to a method of controlling the distribution of surface temperatures of the wafer.

2. Description of the Related Art

The manufacturing process of a semiconductor device includes heat-treating a wafer, or various films such as photoresist films, conductive films, and dielectric films formed on the wafer, at a predetermined temperature so that the structure thereof is stabilized. In particular. Such heat-treating is carried out during photolithography. In photolithography, a photoresist on the wafer is patterned after a predetermined pattern of a reticle, by coating the wafer with photoresist, exposing the coating of photoresist through the reticle, and developing the photoresist to remove the exposed or unexposed portion thereof. For example, when manufacturing a very large scale integrated (VLS!) semiconductor device having a critical dimension (CD) less than 0.3 $\mu$m, after the wafer is coated with a chemically amplified photoresist, a heat treatment is carried out in which the wafer is baked at a temperature within the range of 80~300° C. so that a solvent used to apply the photoresist is evaporated and the photoresist remains on the wafer in the form of a film having a stable structure. Then, a heat treatment referred to as a post exposure bake (referred to as "PEB" hereinafter) is performed, thereby forming $H^+$ in a continuous reaction. In PEB, an acid catalyst is formed by the decomposition of a photoacid generator (PAG). In addition, after the development process, a heat treatment known as a hard bake is performed to dry the wafer and harden the photoresist. In addition to these heat treatments, a heat treatment for heating the wafer to a temperature higher than the melting point of the photoresist may, if necessary, be performed. This heat treatment causes a proper amount of the photoresist on the wafer to flow on the wafer after the development process, so that a desired critical dimension can be realized.

An example of a heat-treatment apparatus for heat-treating a wafer as described above is schematically shown in FIG. 1. This heat treatment apparatus, namely a bake unit, comprises a housing 1, a heat transfer plate 2 disposed in the housing 1, and a heater 3 located within the heat transfer plate 2. When a wafer 9 is to be heat-treated by the bake unit, the wafer 9 is inserted in the housing 1 and is laid on the heat transfer plate 2, and is heated by heat transferred from the heater 3 via the heat transfer plate 2. Horizontal movement of the wafer 9 on the heat transfer plate 2 is limited by a guide means (not shown).

The surface of the heat transfer plate 2 has a characteristic temperature distribution meaning that different temperatures are produced across the surface thereof when the heater 3 is operated. These varying temperatures occur due to minute differences in dimensions of the heat transfer plate 2, structural differences thereof and the configuration and location of the heater 3 within the heat transfer plate. Therefore, the wafer 9 to be heat-treated is subject to the temperature distribution at the surface of the heat transfer plate 2 on which the wafer 9 is laid, whereby the temperatures at different portions of the wafer 9 vary. In addition, the temperatures within the housing 1 are influenced by the direction and velocity of the air flow around the bake unit. Therefore the distribution of surface temperatures of the wafer 9 heat-treated by the bake unit may fluctuate from the desired surface temperature distribution.

If a PEB is performed on the wafer 9 using the bake unit after exposing a chemically amplified photoresist on the wafer 9 to the same energy level over an entire exposure portion of the wafer, the chemical reaction proceeds at different rates at respective portions of the exposed photoresist on the wafer 9 due to the variations in the surface temperature of the wafer 9. Therefore, different quantities of the solubilized polymer are removed during developing, resulting in irregularities in the critical dimensions. That is, because an active reaction proceeds during PEB in a portion of the photoresist located directly over a region of the wafer 9 having a high surface temperature, a large quantity of the solubilized polymer is produced and the critical dimension of that portion widens during development. On the other hand, because the reaction proceeds relatively slowly in that portion of the photoresist extending over a region of the wafer 9 having a relatively low surface temperature, the critical dimension of that portion narrows during development. Taking this into consideration, differences in temperature within the bake unit are compensated for by regulating the energy levels, at which the respective portions of the photoresist are exposed, to correspond to the temperature distribution characteristic of the bake unit. For instance, the portions of the photoresist extending over the regions of the wafer 9 having a high surface temperature within the bake unit are subjected to a relatively low energy level during the exposure process, whereas the portions of the photoresist extending over the regions of the wafer 9 having a lower surface temperature are subjected to a higher energy level. Consequently, less acid, which will serve as a catalyst during the PEB, is produced in the portion of the photoresist exposed to the lower energy level than in the portion exposed to the higher energy level. Thus, relatively uniform critical dimensions can be acquired by the wafer 9.

However, such uniform critical dimensions degrade when the wafer exposed to energy adjusted in consideration of the temperature distribution characteristic of any one bake unit is heat-treated in another bake unit. Therefore, the wafers which are to be heat-treated more than once must be heat-treated sequentially in the same bake unit.

However, as is well known, the PEB process requires a long time whereas the applying, developing, and exposing of the photoresist can be performed in a relatively short time. That is, the PEB process requires the longest time of all the processes involved in photolithography and therefore, the PEB process is considered to pose a limit on the overall productivity associated with photolithography. The problem, per se, of the low productivity of photolithography as caused by the PEB process could be easily resolved by, for example, heat-treating the exposed wafers using a plurality of bake units disposed in parallel. However, if the exposed wafers are not subjected to PEB in the same bake unit used during the exposure process, the above-described problem of non-uniformity in their critical dimensions arises. Accordingly, the delay caused by the PEB process cannot be overcome without giving rise to other significant problems. Thus, the productivity associated with photolithography remains low.

SUMMARY OF THE INVENTION

It is therefore an object of the present invention to provide a method of and an apparatus for heat-treating a wafer such that the distribution of surface temperatures of the wafer when heat-treated corresponds to a desired distribution of surface temperatures determined in advance of the heat-treatment.

To achieve this object, the heat-treating apparatus of the present invention includes a heat transfer plate, a heater, and a plurality of spacers projecting from the upper surface of the heat transfer plate such that a wafer to be heat-treated can be supported by the spacers while facing and being spaced from the heat transfer plate. The spacing between the wafer supported by the spacers and the heat transfer plate and the inclination of the wafer relative to the upper surface of the heat transfer plate can be adjusted by the spacers to produce the desired distribution of surface temperatures.

To achieve the object, the method of heat-treating a wafer according to the present invention comprises the steps of setting a wafer in a position above a heat transfer plate, heat-treating the wafer by transferring heat between the heat transfer plate and the wafer disposed thereabove. To set the wafer in position for heat-treatment, the wafer are spaced by and inclined relative to the upper surface of the heat transfer plate by amounts which have been predetermined to produce a desired a distribution of surface temperatures across the wafer when the wafer is heat-treated.

BRIEF DESCRIPTION OF THE DRAWINGS

The above and other objects, features and advantages of the present invention will become more apparent by referring tot he following detailed description of the preferred embodiments thereof made with reference to the attached drawings, of which.

DESCRIPTION OF THE PREFERRED EMBODIMENTS

Figure 1:
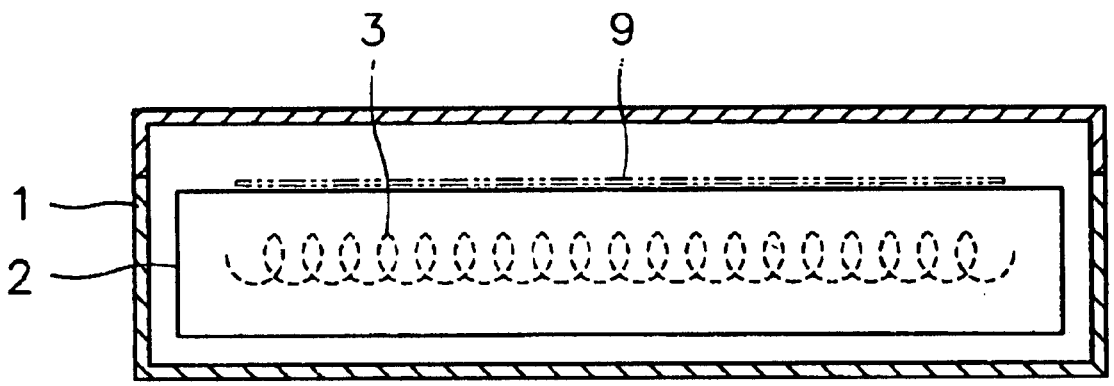
FIG. 1 is a schematic sectional view of a conventional wafer heat-treatment apparatus.
Figure 2:
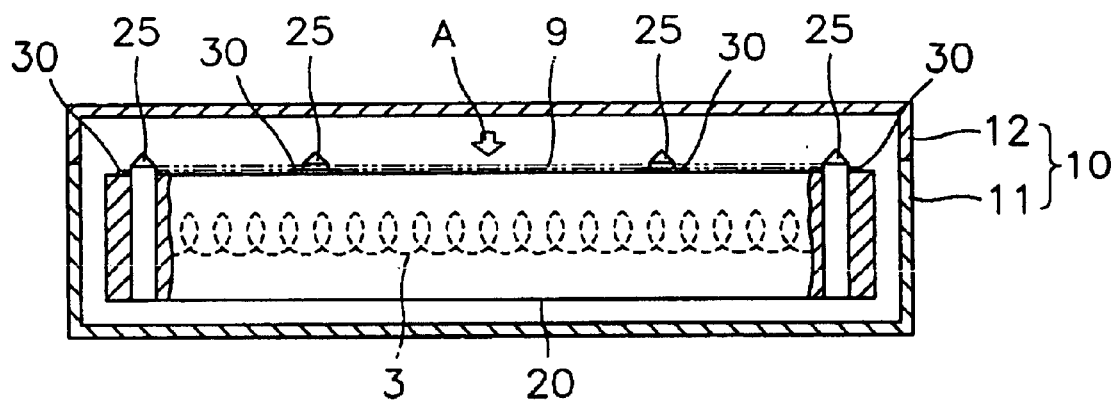
FIG. 2 is a schematic sectional view of an embodiment of a heat-treatment apparatus according to the present invention.
Figure 3:
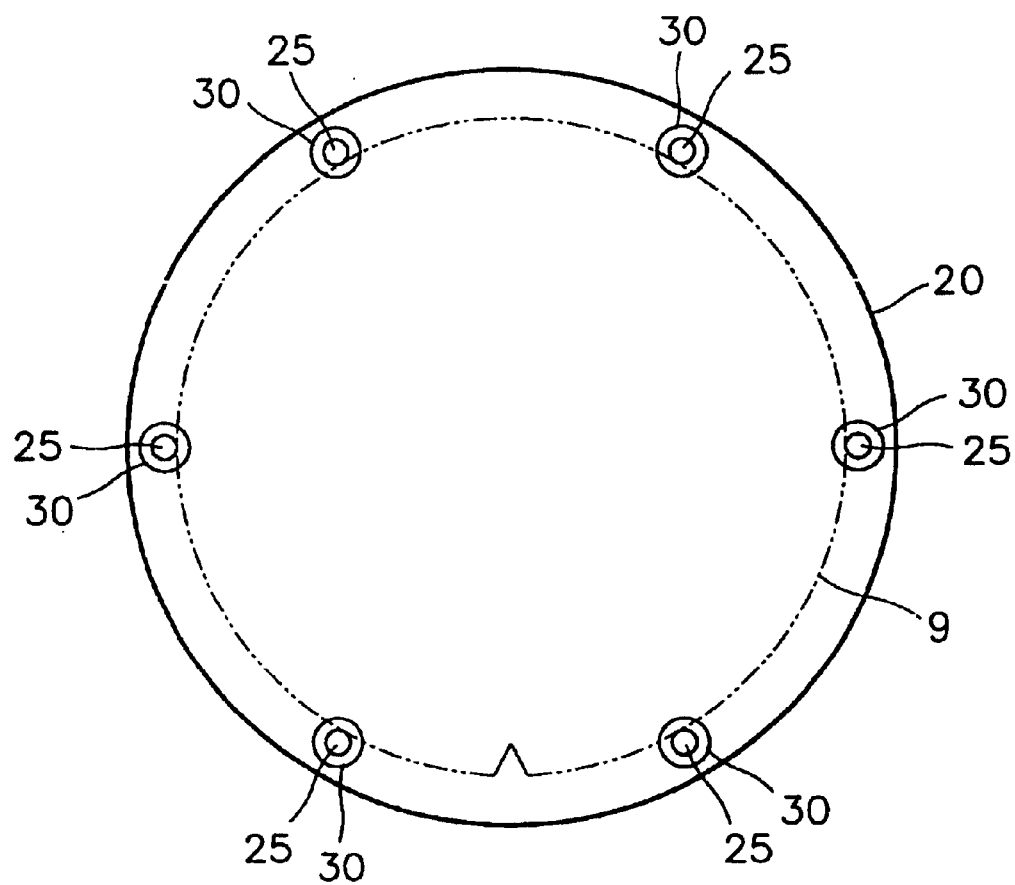
FIG. 3 is a plan view of the heat transfer plate shown from the perspective of arrow A of FIG. 2.

Referring to FIGS. 2 and 3, like the conventional heat treatment apparatus described with reference to FIG. 1, the heat treatment apparatus of the present invention can be used, for example, when a wafer is heat-treated during photolithography. Such a heat treatment apparatus will be referred to hereinafter as a "bake unit" and comprises a housing 10 and a heat transfer plate 20.

The housing 10 includes a lower case 11 and an upper case 12. When a wafer 9 is to be heat-treated, the upper case is separated upwardly from the lower case, the wafer 9 is placed on the heat transfer plate 20, and the upper case 12 is closed so as to once again abut the lower case 11 as shown in FIG. 2, thereby forming a space in which the wafer 9 is heat-treated. The heat transfer plate 20 is provided with a plurality of guide pins 25 intended to be disposed around the wafer 9 for preventing the wafer from moving in horizontal directions. A heater 3 for heating the wafer 9 is disposed within the heat transfer plate 20. Heat generated by the heater 3 is transferred to the wafer 9 via the heat transfer plate 20, whereby the wafer 9 is heat-treated.

On the other hand, as distinguished from the conventional bake unit, the bake unit of the present invention includes spacers 30. Each spacer 30 is thin and annular and extends around a guide pin 25 as resting on the heat transfer plate 20. The spacers 30 project upwardly from the heat transfer plate 20 so that the spacers 30 will support the wafer 9 as spaced from the heat transfer plate 20. Each spacer 30 is freely withdrawable from the guide pin 25 so that it can be replaced, if necessary, with another spacer having a different thickness when the distance between the wafer 9 and the heat transfer plate 20 or the inclination of the wafer 9 relative to the heat transfer plate 20 must be adjusted. To his end, each spacer 30 is preferably loosely fitted to the corresponding guide pin 25 so that the spacer 25 can be easily withdrawn from the guide pin 25 when being replaced.

As with the conventional bake units, the heat transfer plate 20 has a characteristic temperature distribution when the heater 3 is operated. In addition, the temperatures within the housing 10 of the bake unit vary within the housing 10 according to the environment in which the bake unit is located. Therefore, when the wafer 9 is heat-treated within the bake unit, the wafer 9 acquires a characteristic temperature distribution based on the characteristic temperature distribution of the heat transfer plate 20, and the direction and velocity of air flow around the bake unit and the like. A wafer 9 sequentially heat-treated in the same bake unit without change would retain its characteristic temperature distribution.

Nonetheless, the spacers 30 of the present invention allow a plurality of bake units to be used in parallel in, for example, the PEB process without affecting the characteristic temperature distribution of the wafers which have been previously heat-treated in another bake unit.

Figure 4A:
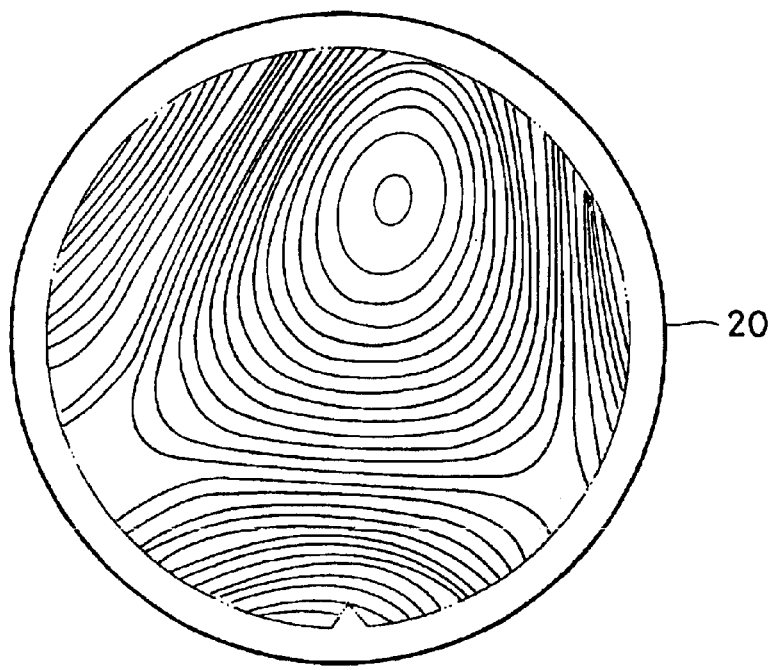
FIGS. 4A and 4B are diagrams illustrating characteristic temperature distributions of first and second heat transfer plates of respective heat-treatment apparatus.
Figure 4B:
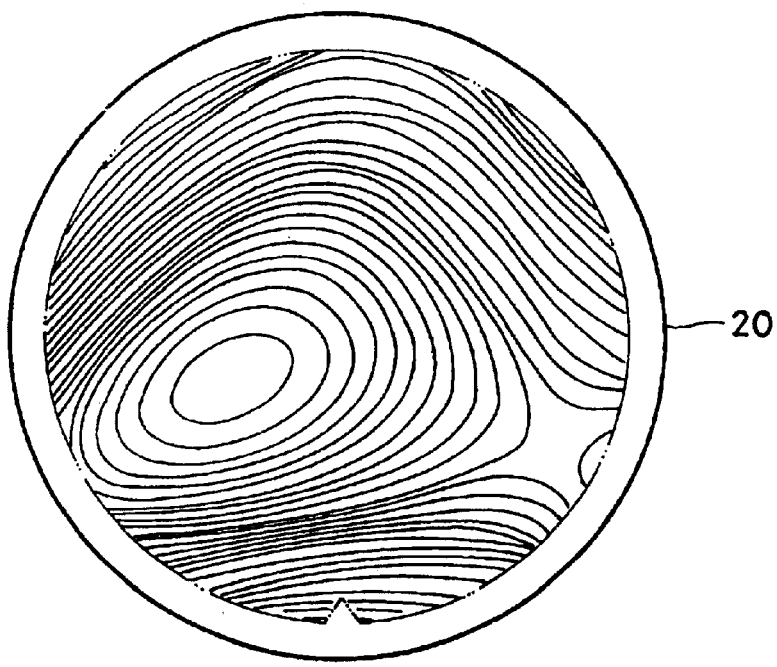

A method of using the bake units of the present invention in parallel will be described in detail with reference to a trial method performed by the present inventors with two bake units disposed in parallel in the manufacturing line. For reference, the characteristic temperature distribution of the heat transfer plate 20 of one of the two bake units (referred to as the "first bake unit" hereinafter) is shown in FIG. 4A, and the characteristic temperature distribution of the heat transfer plate 20 of the other bake unit (referred to as the "second bake unit" hereinafter) is shown in FIG. 4B.

First, spacers 30 having thicknesses of 0.10 mm were inserted around respective guide pins 25 of the heat transfer plate 20 of the first bake unit such that all of the projections provided by the spacers 30 around the guide pins 25 were 0.10 mm high with respect to the upper surface of the heat transfer plate 20. Then, after the heater 3 of the first bake unit was operated and the heat transfer plate 20 reached a desired temperature, i.e. was in a sufficiently stabilized state, a sample wafer 9 was placed on the spacers 30 of the first bake unit. The wafer 9 was heated to within a range of desired temperatures and once the temperature of the wafer 9 had sufficiently stabilized, the surface temperatures of the wafer 9 were measured.

Various methods of determining the distribution of surface temperatures of a wafer are known. The present inventors used a method in which a dummy wafer provided with temperature measuring sensors installed at a plurality of portions thereof was used, and the surface temperatures at these locations were measured based on the signals generated by the temperature measuring sensors.

Figure 5A:
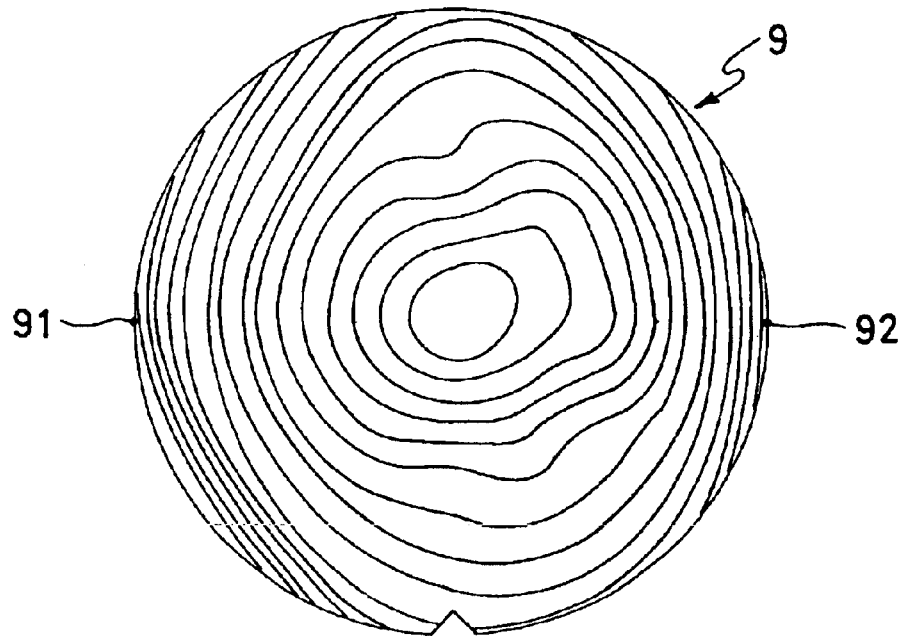
FIGS. 5A and 5B are diagrams illustrating the surface temperature distributions of wafers heat-treated by using the first and second heat transfer plates having the characteristic temperature distributions shown in FIGS. 4A and 4B, respectively.

The results of these measurements are shown by the isothermal lines in FIG. 5A. These results show that the surface of the wafer 9 exhibited a temperature distribution in which the temperatures of the central portion thereof was the highest and those of the peripheral portion were the lowest, and that the left edge portion 91 and the right edge portion 92 had almost the same temperature distribution. Specifically, the central portion had a temperature of 146.36° C., and the peripheral portion had a temperature of 145.81° C., the temperature difference between the two being 0.55° C., and the mean temperature of the entire surface of the wafer 9 being 146.06° C.

Next, spacers 30 each having a thicknesses of 0.10 mm were used in the second bake unit, such that all of the projections provided by the spacers 30 around the guide pins 25 were also 0.10 mm high with respect to the upper surface of the heat transfer plate 20. Thereafter, a wafer 9 was baked under the same conditions used with respect to the first bake unit, and the surface temperatures of the wafer 9 were measured.

Figure 5B:
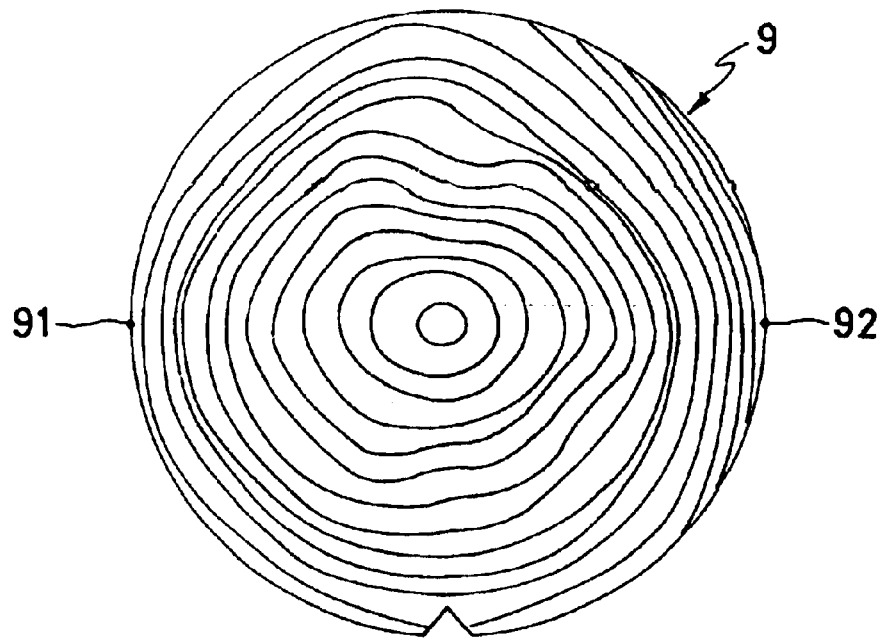

The result of these measurements are shown by the isothermal lines in FIG. 5B. These results show that the surface of the wafer 9 exhibited a temperature distribution in which the temperature of the left edge portion 91 was higher than that of the right edge portion 92 and in which the temperature difference therebetween was relatively large. Specifically, the central portion had the highest temperature of any portion of the surface of the wafer 9, namely 145.81° C., the peripheral portion had the lowest temperature, namely 145.16° C., the temperature difference therebetween was 0.65° C., and the mean temperature of the entire surface of the wafer 9 was 145.49° C.

Thereafter, the conventional method was tested. In this case, the exposure energy produced by an exposure unit of photolithography apparatus was adjusted based on the surface temperature distribution of the wafer treated within the first bake unit. Then, a first wafer exposed by the exposure unit was heat-treated using the first bake unit and a second wafer also exposed by the exposure unit was heat-treated using the second bake unit. The critical dimensions of the wafer baked using the second bake unit were found to be significantly degraded by the PEB.

Next, considering that the left portion of a wafer heat-treated in the second bake unit will be heated to a higher temperature than the right portion thereof, the spacers of the second bake unit were changed. More specifically, spacers were provided so that the spacing between the left edge portion 91 of the wafer 9 and the heat transfer plate 20 of the second bake unit was 0.11 mm, and the spacing between the right edge portion 92 of the wafer 9 and the heat transfer plate 20 was 0.09, whereby the temperature of the left portion of the wafer 9 would be relatively lower and that of the right portion would be relatively higher than the corresponding portions of the wafer heat-treated in the second bake unit when all of the spacers provided projections of 0.10 mm around the guide pins 25. Thereafter, the wafer 9 was placed on the adjusted spacers, heat-treated, and the surface temperatures of the wafer 9 were measured.

Figure 6:
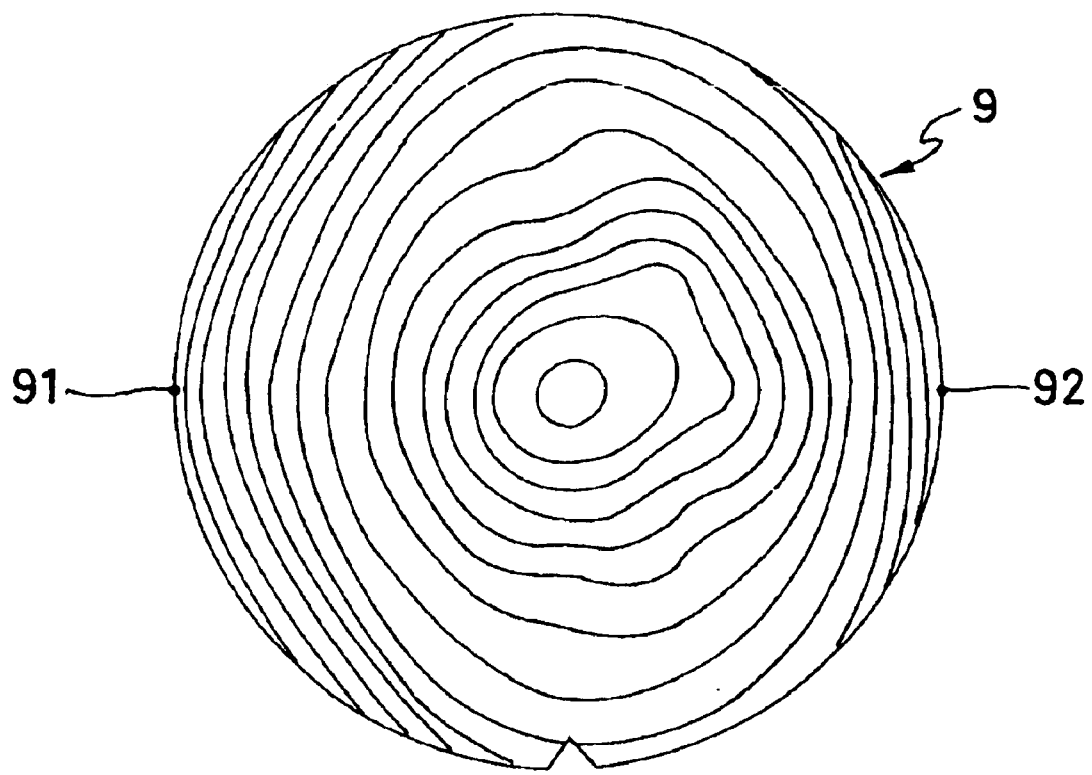
FIG. 6 is a diagram illustrating the surface temperature distribution of a wafer heat-treated by the second heat transfer plate, having the characteristic temperature distribution shown in FIG. 4B, but after spacers of the heat-treatment apparatus had been adjusted according to the present invention.

The result of these measurements are shown in FIG. 6. In this case, the wafer 9 had a temperature distribution in which the temperature of the central portion of the wafer 9 was high and that of the peripheral portion was low, and in which the temperature difference between the left edge portion 91 and the right edge portion 92 was markedly reduced compared to the case when the conventional method was performed, i.e., the wafer 9 had a temperature distribution similar to that of the wafer 9 treated in the first bake unit (FIG. 5A). The central portion had the highest temperature (145.86° C.) of any portion of the surface of the wafer 9, the peripheral portion had the lowest temperature (145.30° C.), the temperature difference was 0.56° C., and the mean temperature of the entire surface of the wafer 9 was 145.55° C.

In addition, when several of the exposed wafers exposed were heat-treated within the second bake unit and developed, and the critical dimensions thereof were measured, the critical dimensions of the wafers were found to have been degraded to nearly the same extent as those of the wafer heat-treated using the first bake unit. This reveals that the first and second bake units can be used in parallel to enhance so the productivity of the manufacturing line.

And, even though the smaller the spacing between the wafer 9 and the heat transfer plate 20, the quicker the wafer stabilizes at its highest temperature, the distribution of surface temperatures of the wafer 9 nonetheless disadvantageously approaches the characteristic temperature distribution of the heat transfer plate 20. And, even though the distribution of the surface temperature of the wafer 9 becomes more independent of the characteristic temperature distribution of the heat transfer plate 20 as the spacing between the wafer and the heat transfer plate increases, the time required for the temperature of the wafer to stabilize at its highest temperature disadvantageously increases as well. Therefore, the spacing between the wafer 9 and the heat transfer plate 20 should be predetermined only considering the conditions existing at the actual site where the wafer 9 is to be heat-treated. The present inventors found through separate simulations that, for their tests, the most suitable mean spacing between the wafer 9 and the heat transfer plate 20 was 0.10 mm, and the above-described tests were performed based on the results of these simulations.

In the method according to the present invention, a desired distribution of surface temperatures of the wafer 9 can be produced by adjusting the inclination of the wafer 9 and the spacing between the wafer 9 and the heat transfer plate 20, that is, by adjusting the heights of the projections provided by the spacers 39. Therefore, for example, when the distribution of surface temperatures of a wafer produced by the heat treatment performed by any one bake unit is taken as a reference standard, other bake units can be adjusted based on the reference distribution of surface temperatures, so that a plurality of wafers can be simultaneously heat-treated using the plurality of bake units, whereby the wafers will possess uniform characteristics. Thus, the present invention is particularly well-suited to a manufacturing process requiring precise temperature control, such as the PEB process.

Although the present invention has been described as comprising annular spacers which allow the spacing between the wafer 9 and the heat transfer plate 20 to be adjusted, various other means may be employed which enable the heights of projections on which the wafer rests to be adjusted.

Figure 7:
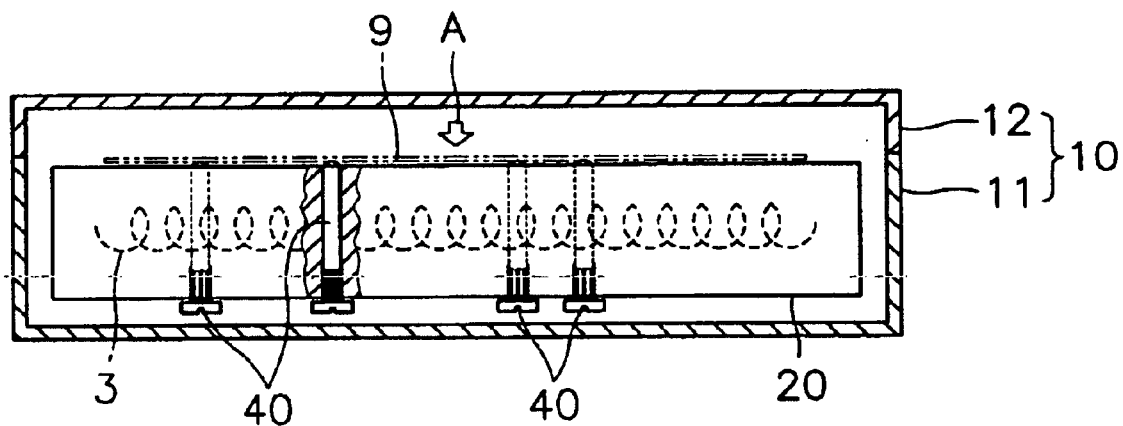
FIG. 7 is a schematic sectional view illustrating a heat-treatment apparatus for a wafer according to another embodiment of the present invention.
Figure 8:
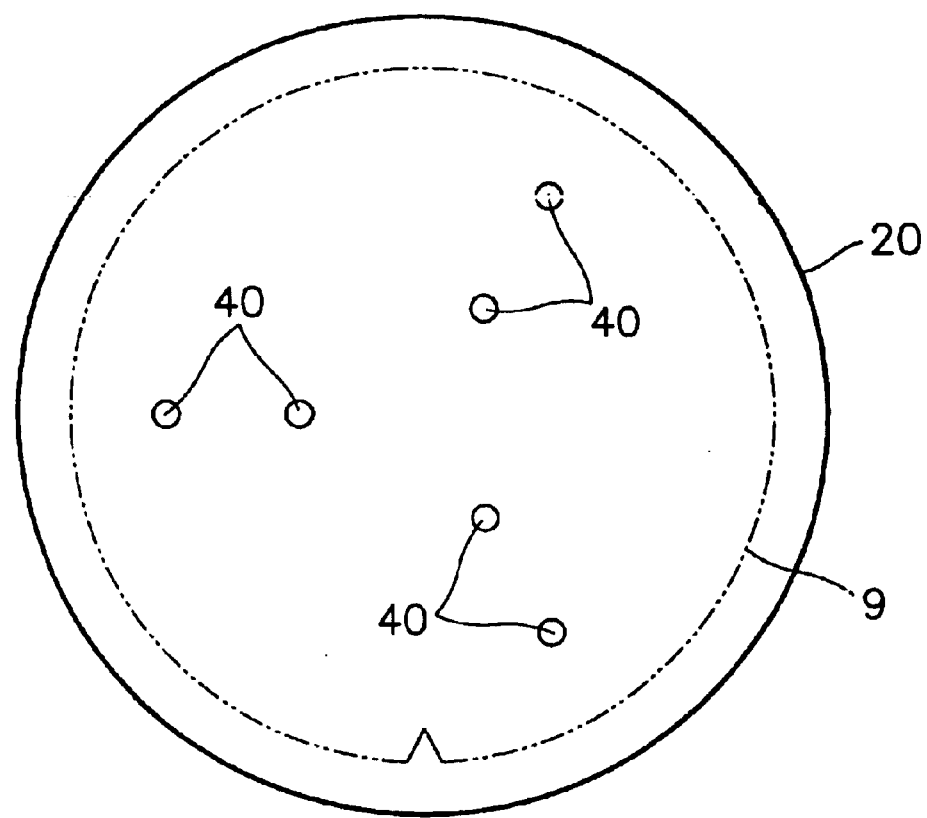
FIG. 8 is a plan view of the heat transfer plate of FIG. 7 shown from the perspective in the direction indicated by arrow A.

For instance, FIGS. 7 and 8 show another embodiment of a bake unit according to the present invention. In this bake unit, a housing 10, a heat transfer plate 20 and a heater 3 are similar to those described with reference to the embodiment of FIG. 2. On the other hand, the bake unit of this embodiment is provided with pin like spacers 40.

The upper end of each spacer 40 projects from the upper surface of the heat transfer plate 20 so that a wafer 9 inserted in the housing 10 can be spaced from the heat transfer plate 20 as supported by the spacers 40. The spacers 40 can be vertically movable individually with respect to the heat transfer plate 20. Various means can be employed to allow the spacers 40 to be vertically movable with respect to the heat transfer plate 20. In this embodiment, each spacer 40 is provided with screw threads mated to female threads formed in the heat transfer plate 20. Therefore, when a torque is applied to each spacer 40, the spacer 40 will be raised or lowered. Accordingly the height of the spacer 40 can be properly adjusted and selected. The material of the spacers 40 is preferably the same as that of the heat transfer plate 20 to provide for an effective transfer of heat to the wafer.

Because the height of the spacers 40 can be adjusted independently of one another by a technician, the spacing between different portions of the wafer 9 and the heat transfer plate 20 can be adjusted. Therefore, these bake units can be used in parallel for the same for the same advantage as described with reference to the embodiment of FIG. 2.

Figure 9:
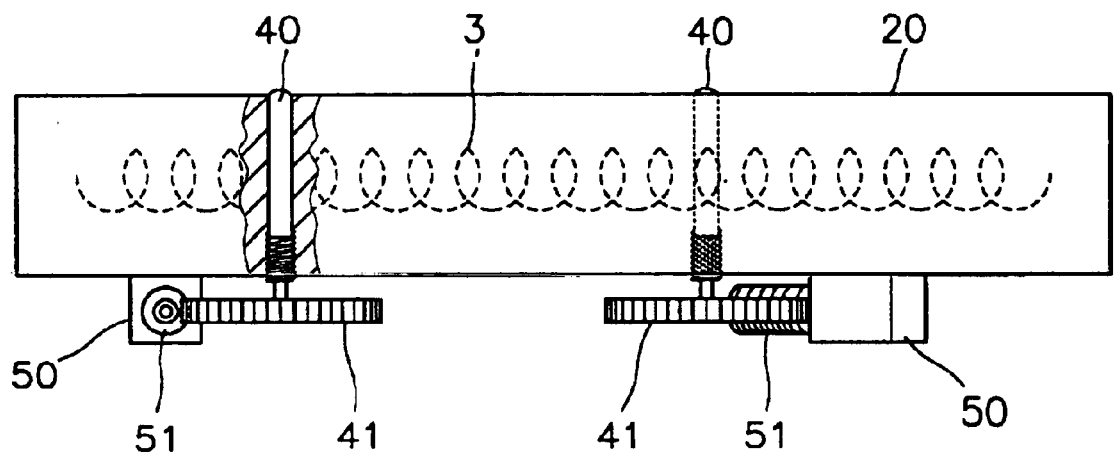
FIG. 9 is a front view illustrating the heat transfer plate portion according to still another embodiment of the present invention.
Figure 10:
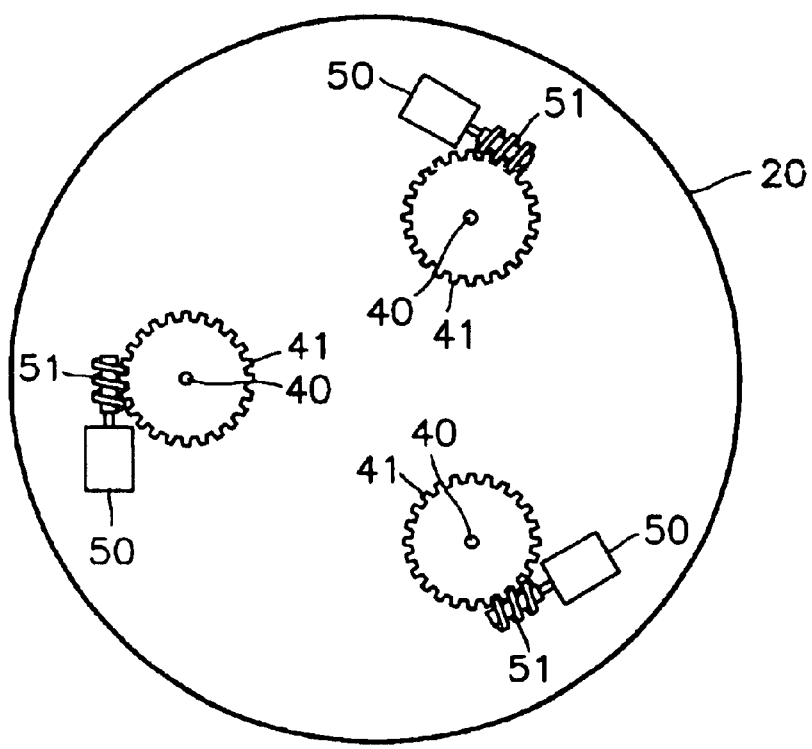
FIG. 10 is a schematic bottom view diagram illustrating the heat transfer plate shown in FIG. 9.

FIGS. 9 and 10 show a heat transfer plate of still another embodiment of a bake unit according to the present invention.

In this embodiment, three spacers 40 comprising pins similar to the spacers 40 of the embodiment shown in FIG. 7 extend through the heat transfer plate 20. However, in this embodiment, three motors 50 and a power transmission mechanism are coupled tot he spacers 40. The power transmission mechanism transfers the powers of the motors 50 to the corresponding spacers 40, and comprises worm wheels 41 fixed to the spacers 40, respectively, and worms 51 assembled to the output shafts of the motors 50 and engaged with the worm wheels 41.

When any one of the motors 50 operates, the spacer 40 associated with the motor 50 is rotated by the power transferred via the worm 51 assembled to the output shaft of the motor 50 and the worm wheel 41 engaged with the worm wheel 51. Accordingly, the spacer 40 is raised or lowered with respect to the heat transfer plate 20. Because the heights of the spacers 40 with respect to the heat transfer plate 20 can be adjusted independently of one another, a plurality of these bake units can be disposed in parallel for performing the same stage of heat-treatment.

Although the present invention has been described with respect to the preferred embodiments thereof, many changes thereto and modifications thereof will become apparent to those of ordinary skill in the art.

For example, the power transmission mechanism of the embodiment of FIGS. 9 and 10 has been described and shown as a worm 51 fixed to the output shaft of the motor 50, and a worm wheel 41 engaged with the worm 51 and fixed to the spacer 40. However, the present invention is not limited to such a structure and other power transmission mechanisms may be employed. The worm wheel 41 may instead be connected to a spacer 40 via a plurality of reduction gears instead of being directly connected thereto. In addition, as the means for moving the spacers 40 vertically, any one of numerous means, known to those of ordinary skill in the art, of converting the torque of a motor into linear motion, may be employed by the present invention without departing from the spirit thereof.

Still further, the motors 50 may be separately operated by switches manually operated by a technician or, for example, may be automatically operated by a signal generated by a controller based on the difference between the actual surface temperature distribution of a wafer and temperature distribution data input to controller in advance.

Furthermore, although the housing 10 has been described and shown as comprising a lower case 11 and an upper case 12, it should be understood that the housing could be of one piece with a doorway for a wafer formed at one side of the housing.

And, although the present invention has been described in connection with photolithography, the present invention can be applied to any semiconductor manufacturing process which involves the heat-treating of a wafer.

In addition, although the present invention has been described as a bake unit provided with a heater 3 in the heat transfer plate 20 for heating the wafer 9, the present invention can be applied to a structure in which cooling water is circulated in or a cooling source is installed in the heat transfer plate for cooling the wafer.

Therefore, all such changes and modifications are seen to be within the true spirit and scope of the present invention as defined by the appended claims.

What is claimed is:

1. A method of temperature-conditioning a wafer, the method comprising:

determining temperatures produced by a temperature-conditioning process at different locations across the surface of a wafer, and using the temperatures to pre-determine a distribution of surface temperatures desired for a wafer;

subsequently placing a wafer in position above the upper surface of a heat transfer plate of a temperature-conditioning apparatus, which heat transfer plate produces heat used in carrying out the temperature-conditioning process;

while the wafer is spaced above the upper surface of the heat transfer plate, carrying out the temperature-conditioning process by transferring heat between the heat transfer plate and the wafer; and before the temperature-conditioning process is carried out on the wafer using the heat transfer plate, determining a spacing of the wafer from the upper surface of the heat transfer plate and an inclination of the wafer relative to the upper surface of the heat transfer plate tending to produce said desired distribution of surface temperatures across the wafer when the wafer is temperature-conditioned using the heat transfer plate, and wherein said placing of the wafer in position comprises setting the wafer above the heat transfer plate with said spacing and said inclination relative to the upper surface of the heat transfer plate.

2. The method of temperature-conditioning a wafer as claimed in claim 1, wherein said determining of the temperatures at different locations across the surface of a wafer comprises measuring the temperatures at said different locations across the surface of the wafer after the wafer is temperature-conditioned in a temperature-conditioning apparatus different from that having said heat transfer plate, and said using the temperatures to determine a desired distribution of surface temperatures comprises selecting as the desired distribution of surface temperatures one which corresponds to the measured temperatures.

3. The method of temperature-conditioning a wafer as claimed in claim 2, wherein said placing of the wafer in position comprises setting the wafer atop spacers projecting above the upper surface of the heat transfer plate, and adjusting the spacers to vary the amounts by which they project above the upper surface to ones necessary for producing the desired distribution of surface temperatures while the wafer is supported by the spacers above the heat transfer plate as the wafer is being heat-treated.

4. The method of temperature-conditioning a wafer as claimed in claim 1, wherein said placing of the wafer in position comprises setting the wafer atop spacers projecting above the upper surface of the heat transfer plate, and adjusting the spacers to vary the amounts by which they project above the upper surface to ones necessary for producing the desired distribution of surface temperatures while the wafer is supported by the spacers above the heat transfer plate as the wafer is being heat-treated.

5. A method of temperature-conditioning a plurality of wafers, said method comprising:

measuring the temperatures at different locations across the surface of a wafer after the wafer is temperature-conditioned in a reference temperature-conditioning apparatus;

using the measured temperatures to determine a desired distribution of surface temperatures for the plurality of wafers;

disposing a plurality of temperature-conditioning apparatuses in parallel, each having a respective heat transfer plate;

placing each of the plurality of wafers in position above the upper surface of a respective heat transfer plate of the temperature-conditioning apparatuses, which heat transfer plate produces heat used in carrying out a temperature-conditioning process;

while the wafers are spaced above the upper surface of the heat transfer plates, respectively, carrying out the temperature-conditioning process on the wafers by transferring heat between the heat transfer plates and the wafers; and before the temperature-conditioning process is carried out on the wafers using the heat transfer plates, respectively, independently determining for each heat transfer plate a spacing of the wafer from the upper surface of the heat transfer plate and an inclination of the wafer relative to the upper surface of the heat transfer plate tending to produce said desired distribution of surface temperatures across the wafer when the wafer is temperature-conditioned using the heat transfer plate, and wherein said placing of the wafers in position comprises setting the wafers above the heat transfer plates with said independently determined spacings and inclinations relative to the upper surface of the transfer plates.

* * * * *